(12) United States Patent
Zimmerman et al.

(10) Patent No.: US 11,795,809 B2
(45) Date of Patent: Oct. 24, 2023

(54) ELECTRONICS ENCLOSURE FOR DOWNHOLE TOOLS

(71) Applicant: Halliburton Energy Services, Inc., Houston, TX (US)

(72) Inventors: Mark A. Zimmerman, Houston, TX (US); Mukul M. Agnihotri, Spring, TX (US); Michael Dewayne Finke, Cypress, TX (US)

(73) Assignee: Halliburton Energy Services, Inc., Houston, TX (US)

(*) Notice: Subject to any disclaimer, the term of this patent is extended or adjusted under 35 U.S.C. 154(b) by 45 days.

(21) Appl. No.: 17/538,637

(22) Filed: Nov. 30, 2021

(65) Prior Publication Data
US 2023/0167734 A1    Jun. 1, 2023

(51) Int. Cl.
*H05K 5/00* (2006.01)
*E21B 47/017* (2012.01)
*H05K 5/06* (2006.01)

(52) U.S. Cl.
CPC ............. *E21B 47/017* (2020.05); *H05K 5/06* (2013.01)

(58) Field of Classification Search
CPC ................................ E21B 47/017; H05K 5/06
USPC ............................................................ 361/748
See application file for complete search history.

(56) References Cited

U.S. PATENT DOCUMENTS

| | | | | |
|---|---|---|---|---|
| 6,012,537 A * | 1/2000 | Rountree | ............... | E21B 44/005 166/242.1 |
| 6,134,892 A * | 10/2000 | Turner | ................... | H10N 10/00 62/3.2 |
| 8,297,351 B2 * | 10/2012 | Yoshiuchi | .......... | G01N 27/4146 166/250.01 |
| 10,787,897 B2 | 9/2020 | Treviranus et al. | | |
| 2013/0235537 A1 * | 9/2013 | Swett | .................. | E21B 47/0175 361/752 |
| 2013/0329356 A1 * | 12/2013 | Shanbhogue | .......... | H05K 1/144 361/714 |
| 2015/0275652 A1 * | 10/2015 | Fanini | ..................... | E21B 47/01 166/162 |
| 2016/0265289 A1 * | 9/2016 | Goodman | ........... | E21B 47/0175 |

(Continued)

FOREIGN PATENT DOCUMENTS

| | | | | |
|---|---|---|---|---|
| CN | 102027189 A | * | 4/2011 | ............. E21B 23/01 |
| EP | 0148694 | | 7/1985 | |

(Continued)

OTHER PUBLICATIONS

International Search Report and Written Opinion for Application No. PCT/US2021/063153, dated Aug. 17, 2022.

*Primary Examiner* — Anatoly Vortman
*Assistant Examiner* — Zhengfu J Feng
(74) *Attorney, Agent, or Firm* — Benjamin Ford; C. Tumey Law Group PLLC

(57) ABSTRACT

An electronics enclosure system includes a pressure housing with a thermally conductive material and a plurality of shells disposed within the pressure housing, wherein the plurality of shells are coupled together to form an enclosure, and wherein each shell of the plurality of shells comprises thermally conductive material. The electronics enclosure system further includes at least one circuit board secured to an inner surface of a respective shell of the plurality of shells and a plurality of electronic components secured to the at least one circuit board, the plurality of shells, or some combination thereof.

19 Claims, 5 Drawing Sheets

(56) References Cited

U.S. PATENT DOCUMENTS

| | | | |
|---|---|---|---|
| 2020/0370422 A1* | 11/2020 | Finke | ................. E21B 49/10 |
| 2020/0408081 A1 | 12/2020 | Finke et al. | |
| 2021/0071492 A1 | 3/2021 | Fripp et al. | |
| 2021/0140241 A1 | 5/2021 | Deolalikar et al. | |
| 2021/0363826 A1 | 11/2021 | Powell | |

FOREIGN PATENT DOCUMENTS

| | | |
|---|---|---|
| EP | 2853682 | 4/2015 |
| WO | 2012-011978 | 1/2012 |

\* cited by examiner

ELECTRONICS ENCLOSURE FOR DOWNHOLE TOOLS

BACKGROUND

In order to obtain hydrocarbons such as oil and gas, boreholes are drilled through hydrocarbon-bearing subsurface formations. During drilling operations, directionally drilling operations may by performed where the drilling direction may veer of an intended drilling path at an angle or even horizontally away from the drilling path. Directional drilling of a subterranean well and, in particular, controlling the angle and direction of drilling through selectable bending of a shaft is controlled by a steering sub connected to the drill bit. Due to the extreme environment experienced by directional drilling equipment, failure of machinery during drilling operations may be possible.

Such downhole tools often comprise electronic equipment and modules used for various purposes, such as controlling the downhole tools, communicating with a surface location, and storage and analysis of monitored wellbore data. Such electronic modules typically comprise circuit boards, such as printed circuit boards (PCBs) that are packaged to provide protection from harsh downhole environmental conditions, such as elevated temperatures and pressures, vibration, thermo-mechanical stresses, and thermal shock. Prior to being installed in a downhole tool for use, electronic modules must also be capable of surviving transport and field handling without premature failures resulting from shock and vibration.

Conventional approaches to packaging downhole electronic modules comprise "potting" the electronic modules in a foam or silicone substance. While potting is a viable solution for surviving harsh downhole environments, it is subject to potential manufacturing and field maintenance problems. For example, after a significant investment in building and testing the electronic modules, they may become damaged beyond repair during the subsequent foaming/potting process. When the potting cures, for instance, it can move wires and/or place stress on various electronic components of the circuit board, thereby increasing the failure rate of the circuit board.

Another conventional approach to packaging a downhole electronic module for downhole use comprises wet mounting the electronic module in a particular downhole tool. Again, this approach may provide a viable downhole solution for withstanding harsh downhole environments, but permanent damage often results from the aggressive procedures required to remove the electronic modules for maintenance or replacement.

Problems inherent in designing electronics packaging for the downhole environment include, high levels of shock and vibration, high temperature, high pressure, corrosive conditions, abrasive conditions, erosion issues, space restrictions, and heat dissipation.

BRIEF DESCRIPTION OF THE DRAWINGS

These drawings illustrate certain aspects of some examples of the present disclosure and should not be used to limit or define the disclosure.

DETAILED DESCRIPTION

Described below are methods and systems for packaging and transport of electronic equipment used in the oil and gas industry and, more particularly, to downhole electronic assemblies that may be secured to various downhole tools for downhole use. As discussed below, electronics may be packaged in an electronics enclosure system having individual semi cylindrical shells. Electronic components may be mounted inside respective shells. Some electronic components are mounted directly to the respective shells such that heat may conduct from the electronic components to the respective shells. Other electronic components may be secured to circuit boards (PCBs) that are attached to the respective shells, and heat from those electronic components may be transferred to the respective shells via the circuit boards and/or heat transfer features. The shells (two or more) are coupled together to form an enclosure having a substantially cylindrical shape. A thermally conductive elastomeric material may then adhere to the outer diameter of the enclosure (e.g., electronics cylinder) and a thermally conductive gel/paste is applied to the exterior of the elastomer. Circumferential seals may be located on both sides of the elastomer and serve to contain migration of the thermal gel. Additionally, the ends of the covers are configured such that multiple assemblies may be stacked together and installed into a protective pressure housing.

Figure 1:
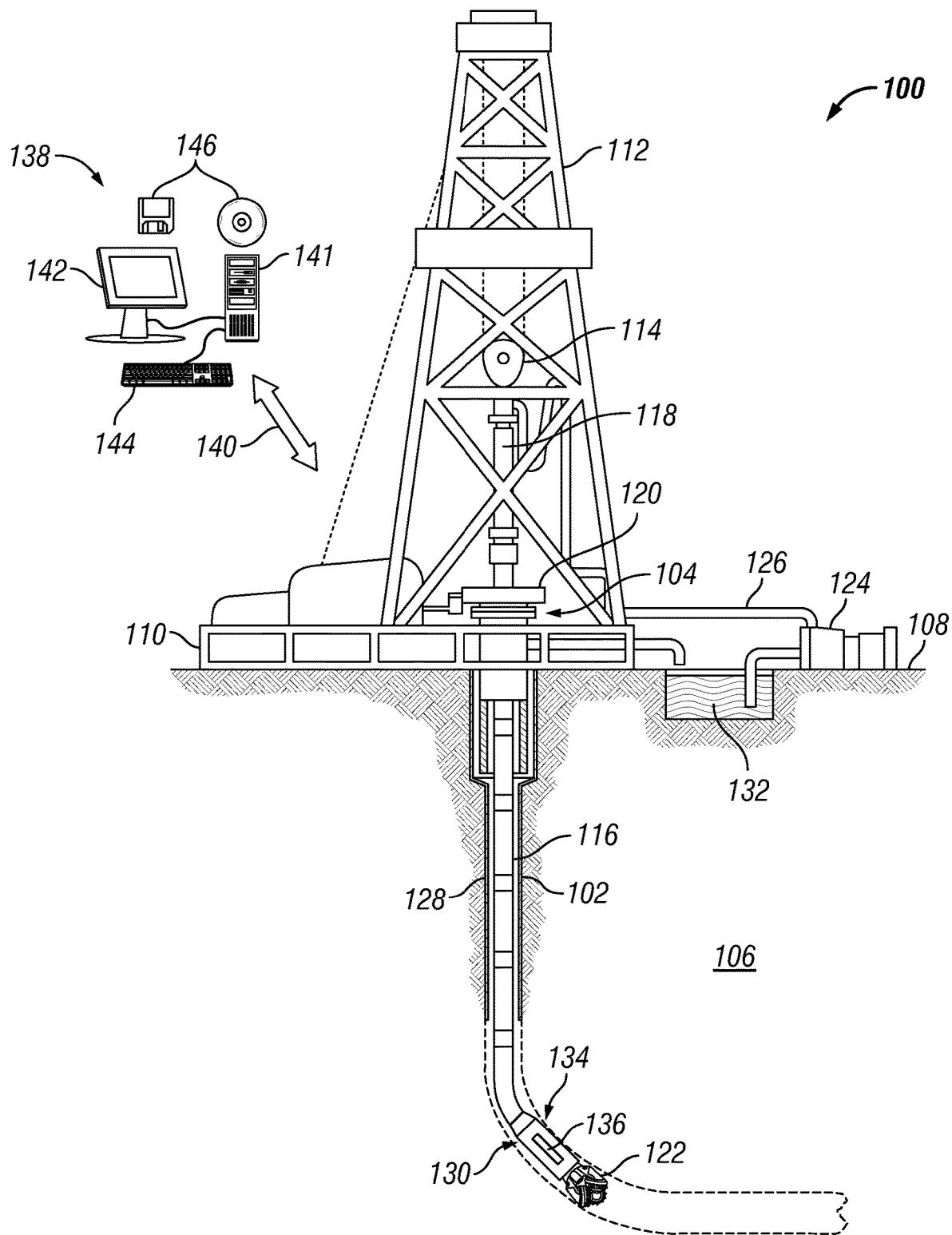
FIG. 1 illustrate an example of a drilling system, in accordance with some embodiments of the present disclosure.

FIG. 1 illustrates a drilling system 100 in accordance with example embodiments. As illustrated, borehole 102 may extend from a wellhead 104 into a subterranean formation 106 from a surface 108. Generally, borehole 102 may comprise horizontal, vertical, slanted, curved, and other types of borehole geometries and orientations. Borehole 102 may be cased or uncased. In examples, borehole 102 may comprise a metallic member. By way of example, the metallic member may be a casing, liner, tubing, or other elongated steel tubular disposed in borehole 102.

As illustrated, borehole 102 may extend through subterranean formation 106. As illustrated in FIG. 1, borehole 102 may extend generally vertically into the subterranean formation 106, however borehole 102 may extend at an angle through subterranean formation 106, such as horizontal and slanted boreholes. For example, although FIG. 1 illustrates a vertical or low inclination angle well, high inclination angle or horizontal placement of the well and equipment may be possible. It should further be noted that while FIG. 1 generally depict land-based operations, those skilled in the art may recognize that the principles described herein are equally applicable to subsea operations that employ floating or sea-based platforms and rigs, without departing from the scope of the disclosure.

As illustrated, a drilling platform 110 may support a derrick 112 having a traveling block 114 for raising and lowering drill string 116. Drill string 116 may include, but is not limited to, drill pipe and coiled tubing, as generally known to those skilled in the art. A kelly 118 may support drill string 116 as it may be lowered through a rotary table 120. A drill bit 122 may be attached to the distal end of drill string 116 and may be driven either by a downhole motor and/or via rotation of drill string 116 from surface 108. Without limitation, drill bit 122 may include, roller cone bits, PDC bits, natural diamond bits, any hole openers, reamers, coring bits, and the like. As drill bit 122 rotates, it may create and extend borehole 102 that penetrates various subterranean formations 106. A pump 124 may circulate drilling fluid through a feed pipe 126 through kelly 118, downhole through interior of drill string 116, through orifices in drill bit 122, back to surface 108 via annulus 128 surrounding drill string 116, and into a retention pit 132.

With continued reference to FIG. 1, drill string 116 may begin at wellhead 104 and may traverse borehole 102. Drill bit 122 may be attached to a distal end of drill string 116 and may be driven, for example, either by a downhole motor and/or via rotation of drill string 116 from surface 108. Drill bit 122 may be a part of a rotary steerable tool (RSS) 130 at distal end of drill string 116. RSS 130 may further comprise tools for real-time health assessment of a rotary steerable tool during drilling operations. As will be appreciated by those of ordinary skill in the art, RSS 130 may be a measurement-while drilling (MWD) or logging-while-drilling (LWD) system.

RSS 130 may comprise any number of tools, such as sensors, transmitters, and/or receivers to perform downhole measurement operations or to perform real-time health assessment of a rotary steerable tool during drilling operations. For example, as illustrated in FIG. 1, RSS 130 may be included on and/or with a bottom hole assembly (BHA) 134. It should be noted that BHA 134 may make up at least a part of RSS 130. Without limitation, any number of different measurement assemblies, communication assemblies, battery assemblies, and/or the like may form RSS 130 with BHA 134. Additionally, BHA 134 may form RSS 130 itself. In examples, BHA 134 may comprise downhole electronics assembly 136, which may be attached to one or more sensors, not illustrated. Downhole electronics assembly 136 may be connected to information handling system 138, discussed below, which may control the operation of sensors disposed on BHA 134. Sensor may comprise (accelerometers, magnetometers, temperature sensors, speed, position sensors, etc.). During operations, sensors may process real time data originating from various sources such as diagnostics data, sensor measurements, operational data, survey measurements, sensory state, drilling system 100 state, BHA 134 state, RSS 130 state, and/or the like. Information and/or measurements may be processed further by information handling system 138.

Drill string 116 may comprise various downhole tools used to help facilitate the drilling operation. For instance, drill string 116 may comprise formation evaluation sensors and directional sensors, such as measuring-while-drilling (MWD) and/or logging-while-drilling (LWD) tools. Drill string 116 may further comprise one or more telemetry devices used to communicate with a surface location. Data obtained by the MWD and LWD tools may be encoded and transmitted to the surface via the telemetry device. Downhole tools disposed on drill string 116 may be connected to suitable electronics for receiving sensor measurements, storing or transmitting data, analyzing data, controlling drill bit 122 and/or performing other functions. Such electronics may be included in a downhole electronics assembly 136 incorporated as part of the drill string 116. The downhole electronics assembly 136 (hereafter "assembly 136") may be configured to be disposed in BHA 134 (e.g., referring to FIG. 1) and otherwise used to provide electronic support and command functions for one or more downhole tools associated with drill string 116, BHA 134, and/or downhole operations.

As described herein, the downhole electronics assembly 136 may comprise the necessary electronic components and modules to operate one or more of the downhole tools of the drill string 116. For instance, the downhole electronics assembly 136 may comprise one or more circuit boards and various electronic modules mounted to the circuit boards. The downhole electronics assembly 136 may be housed within an electronics enclosure system 414 (shown in FIG. 4.) It should be noted that although the embodiments described herein are discussed in the context of circuit boards, the embodiments might be used in conjunction with any electronic component or module that might benefit from a packaging or housing (e.g., the electronics enclosure system 414) having high thermal conduction, low transmissibility, and low fatigue stress. Furthermore, although downhole electronics assembly 136 is described herein as being used in conjunction with drill string 116 and its various downhole tools, the downhole electronics assembly 136 secured within the electronics enclosure system 414 may equally be employed in other high temperature and/or vibration-prone environments, without departing from the scope of the disclosure.

Figure 2:
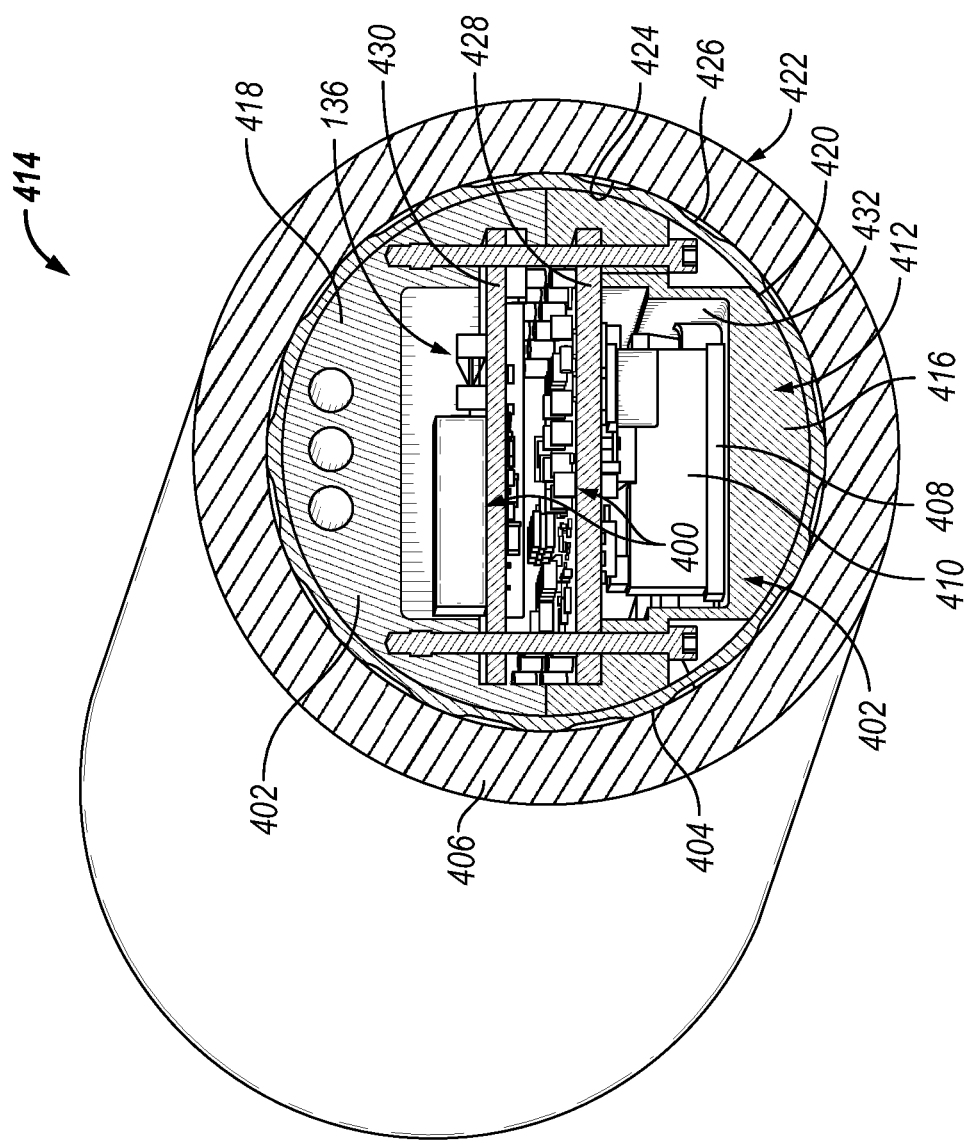
FIG. 2 illustrates a cut away view of a downhole electronics assembly secured within an electronics enclosure system, in accordance with some embodiments of the present disclosure.

FIG. 2 illustrates a cut away view of downhole electronics assembly 136 secured within the electronics enclosure system 414. In the illustrated embodiment, the electronics enclosure system 414 comprises two semi cylindrical shells 402 (e.g., a first semi-cylindrical shell 416 and a second semi-cylindrical shell 418) coupled together to form an enclosure 412 (e.g., a cylindrical enclosure). However, the electronics enclosure system 414 may comprise any suitable number of shells 402 (e.g., three, four, five, etc.) that couple together to form the enclosure 412. Further, the enclosure 412 may have a substantially cylindrical shape. Indeed, an outer surface 420 of the enclosure 412 may have a substantially cylindrical shape. However, the enclosure 412 may comprise any suitable shape for housing the downhole electronics assembly 136. Moreover, the shells 402 of the enclosure 412 may be formed from a thermally conductive material. For example, the shells 402 may comprise an aluminum material. However, the shells 402 may comprise any suitable thermally conductive material.

The electronics enclosure system 414 further comprises a pressure housing 406. In the illustrated embodiment, the pressure housing 406 comprises a hollow cylindrical shape. Accordingly, the pressure housing 406 may comprise a radially outer surface 422 and a radially inner surface 424. The radially outer surface 422 may be exposed to the downhole drilling environment. As set forth below, the pressure housing 406 may be configured to conduct heat from the downhole electronics assembly 136 to a downhole drilling environment. As such, the pressure housing 406 may have a thermally conductive material. For example, the pressure housing 406 may have a nickel chromium alloy or nickel alloy such as Inconel. However, the pressure housing 406 may have any suitable type of thermally conductive material. Moreover, as set forth above, pressure housing 406 may comprise a hollow cylindrical shape. The enclosure 412 may be installed within the hollow portion of the pressure housing 406. Thus, the outer surface 420 of the enclosure 412 has an outer diameter that is smaller than an inner diameter the radially inner surface 424 of the pressure housing 406, such that the enclosure 412 may be installed within the pressure housing 406.

The enclosure 412 may be encased in a thermally conductive elastomer 404 and/or a thermally conductive gel 426, which is also enclosed in the pressure housing 406. The thermally conductive elastomer 404 may be positioned between the outer surface 420 of the enclosure 412 and the radially inner surface 424 of the pressure housing 406. In some embodiments, the thermally conductive elastomer 404 is secured to the outer surface 420 of the enclosure 412 via an adhesive to rigidly connect the thermally conductive elastomer 404 to the enclosure 412. The thermally conductive elastomer 404 may comprise a silicone base material mixed with aluminum oxide, boron nitride, or some combination thereof. Moreover, the thermally conductive elastomer 404 may have a ridged shape. The ridged shape may form a plurality of cavities between the thermally conductive elastomer 404 and the radially inner surface 424 of the pressure housing 406 with the enclosure 412 installed within the pressure housing 406. The thermally conductive gel 426 may be disposed in the plurality of cavities between the thermally conductive elastomer 404 and the pressure housing 406 to increase thermal conductivity from the thermally conductive elastomer 404 to the pressure housing 406. The thermally conductive gel 426 may comprise a thermally conductive silicone with a conductivity between 3.0-7.0 watts per meter-kelvin (W/mK). Further, the thermally conductive gel 426 may be electrically insulating.

Moreover, as illustrated, the downhole electronics assembly 136 may comprise one or more a circuit boards 400 (e.g., a capacitor board 428, a power supply board 430, etc.). As used herein, the term "circuit board" is meant to encompass any means for providing interconnections and mounting of electronic components such as, but not limited to, a printed circuit board (PBC), a printed wiring board (PWB), a printed circuit assembly (PCA), a wire-wrap board, a hybrid (multi-chip) module, a brassboard, a breadboard, and any combination thereof. Electronic components such as capacitors, inductors, power supply components, etc. may be mounted to the circuit board 400. Moreover, the circuit boards 400 may be secured to the enclosure 412. In particular, each circuit board may be secured to an inner surface of a respective shell of the electronics enclosure system 414. In some embodiments, each circuit boards may be rigidly secured to an inner surface of a respective shell via at least one board fastener. In some embodiments, the circuit boards 400 may transfer heat directly to the enclosure 412. However, in some embodiments, the circuit board 400 comprises copper traces extending to an inner surface 432 of the enclosure 412. The copper traces are configured to conduct heat from the circuit board 400, and/or electronic components secured to the circuit board, to the enclosure 412.

Moreover, as will be discussed in greater detail below, the electronics enclosure system 414 comprises thermally conductive pads 408. The thermally conductive pads 408 may support one or more heat generating components 410 (e.g., electronic components). For example, some electronic components (e.g., magnetic device, field-effect transmitter (FET), etc.) may be secured directly to the inner surface 432 of the enclosure 412 (e.g., a respective shell 402). The electronic components may be rigidly secured to the inner surface 432 via at least one component fastener. Further, the thermally conductive pad 408 may be disposed between the inner surface 432 of the enclosure 412 and the heat generating components 410 (e.g., electronic component) of the downhole electronics assembly 136. The thermally conductive pad 408 may conduct heat from the electronic component to the enclosure 412 to help dissipate heat from the downhole electronics assembly 136. Further, the thermally conductive pad 408 may help secure the electronic component to reduce vibration of the electronic component during operation.

As set forth above, heat may be transferred to the enclosure 412 via electronic components directly, thermally conductive pads 408, circuit boards 400, copper traces, or some combination thereof. The heat conducted to the enclosure 412 may be transferred (e.g., conducted) through the enclosure 412 to the thermally conductive elastomer 404. The heat may then be transferred from the thermally conductive elastomer 404 to the pressure housing 406 directly and/or via the thermally conductive gel 426 disposed between portions of the thermally conductive elastomer 404 and the pressure housing 406. The radially outer surface 422 of the pressure housing 406 may be in contact with drilling fluid flowing through the borehole. The heat entering the pressure housing 406 from the downhole electronics assembly 136 may be transferred to the drilling fluid passing along the radially outer surface 422 of the pressure housing 406. The drilling fluid may function as a heat sink for the electronics enclosure system 414.

Figure 3:
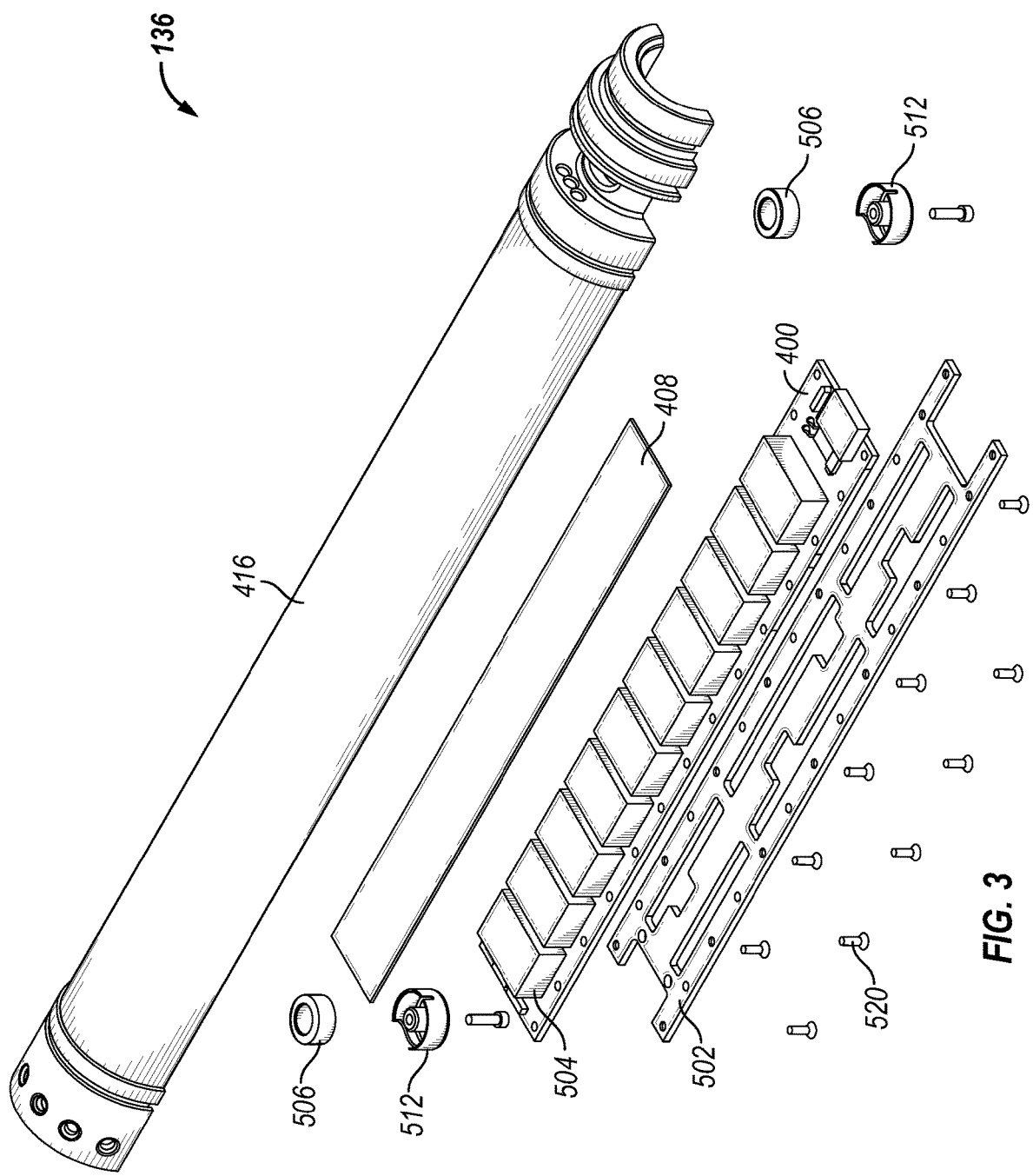
FIG. 3 illustrates an exploded isometric view of the downhole electronics assembly secured within a first shell of an enclosure, in accordance with some embodiments of the present disclosure.

FIG. 3 illustrates an exploded isometric view of a portion of the assembly 136 secured within the first shell 416 of the enclosure 412. In some embodiments, the first shell 416 comprises a ground lug structure 502 that may form a support structure upon which a circuit board 400 may attach. In some embodiments, the circuit board 400 may be fastened to the first shell 416 via a plurality of board fasteners 520. Moreover, in the illustrated embodiment, one or more capacitors 504 are disposed on circuit board 400. The capacitors 504 may be electrically connected to circuit board 400. Additionally, one or more inductors 506 may be secured to first shell 416 by any suitable means and may be enclosed, for protection, by a protective cap 512. In some embodiments, alternative and/or additional electronic components may be mounted onto the circuit board 400. Further, as illustrated, a thermally conductive pad 408 is disposed between circuit board 400 and first shell 416. The thermally conductive pad 408 may contact one or more capacitors 504 and create a thermal conduit between first shell 416 and each capacitor 504 such that heat may be conducted from each capacitor 504 to the first shell 416. Without limitation, thermally conductive pads 408 may comprise silicone, rtbs, carbon-based materials, and/or the like. For example, the thermally conductive pads 408 may comprise a thermally conductive silicone with a conductivity between 3.0-7.0 watts per meter-kelvin (W/mK).

Figure 4:
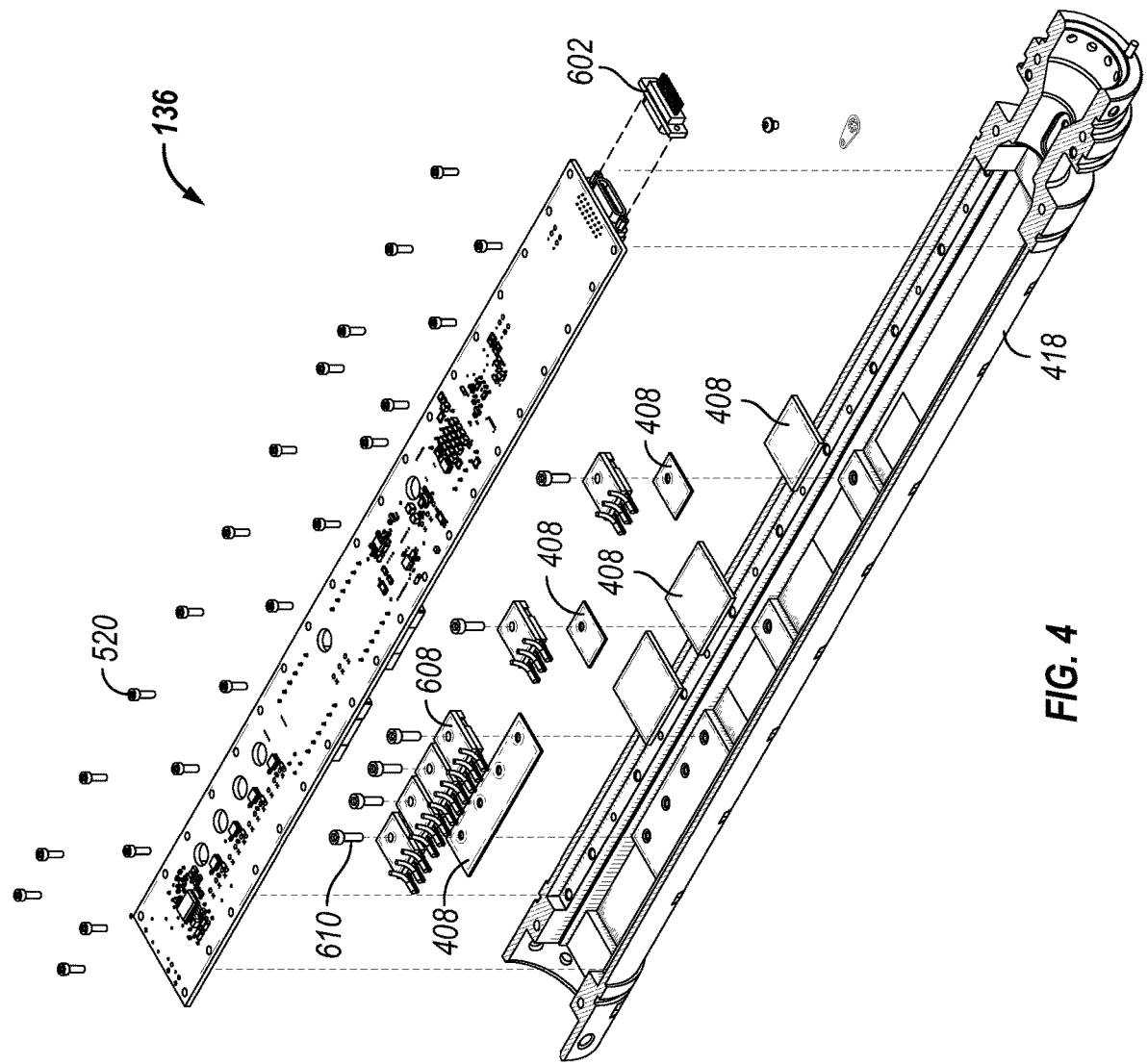
FIG. 4 illustrates another exploded isometric view of the downhole electronics assembly secured within a second shell of the enclosure, in accordance with some embodiments of the present disclosure.

FIG. 4 illustrates an exploded isometric view of a portion of the assembly 136 secured within the second shell 418 of the enclosure 412. Circuit board 400 may attach directly to second shell 418 via the plurality of board fasteners 520. Disposed on circuit board 400 are one or more power supplies and/or electronics that may be utilized to power one or more sensors disposed in and/or along BHA 134 (e.g., referring to FIG. 1). As illustrated, there may be one or more thermally conductive pads 408 may be disposed between second shell 418 and the one or more power supplies and/or electronics disposed on circuit board 400. Additionally, one or more electronic components 608 (e.g., diodes, field-effect transmitters, transformers, etc.) may be secured directly to the second shell 418 via one or more component fasteners 610. One or more thermally conductive pads 408 may be disposed between each electronic component 608 and the second shell 418. Moreover, a mating connector 602 may connect circuit board 400 to the one or more sensors disposed in and/or along BHA 134.

Figure 5:
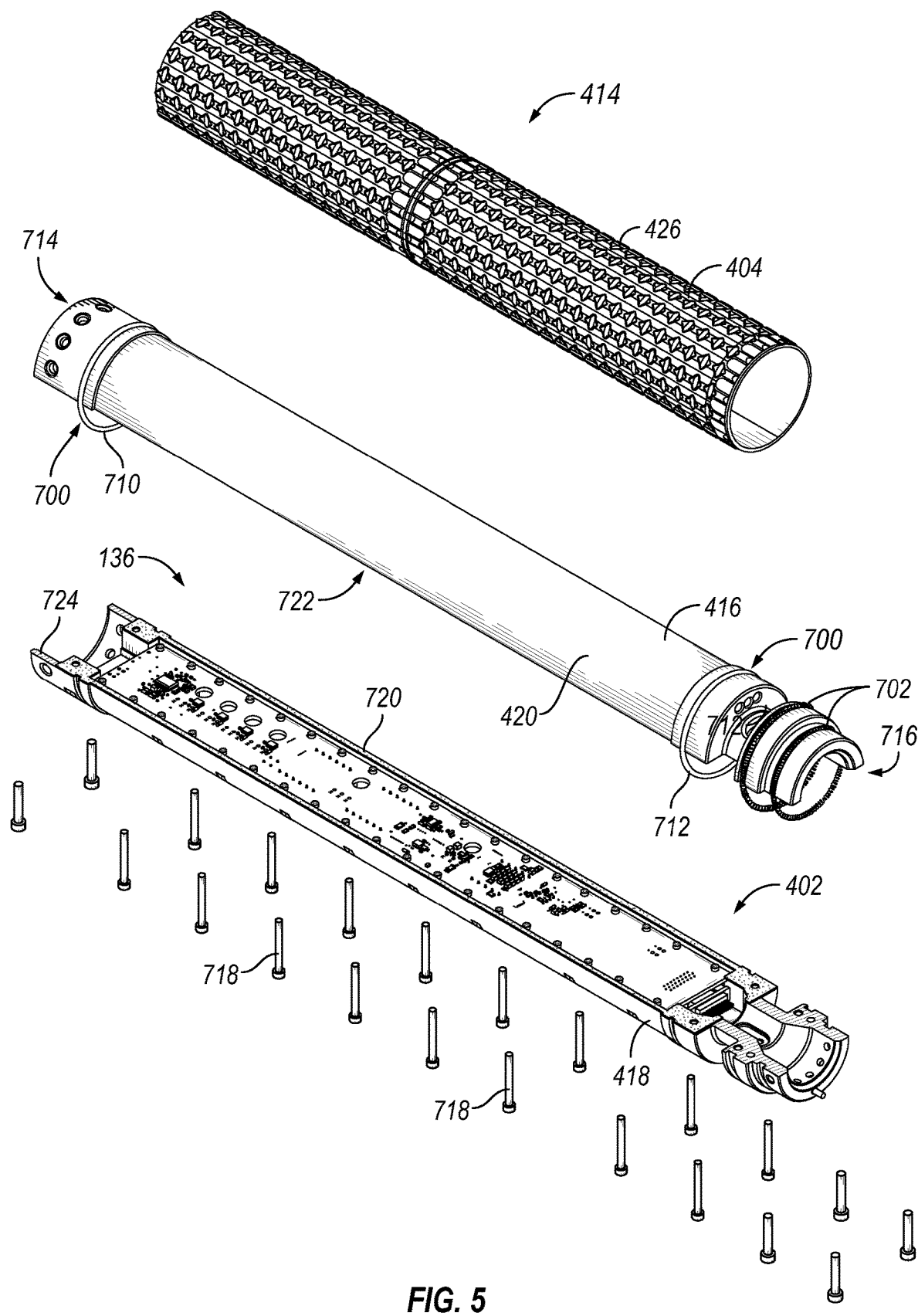
FIG. 5 illustrates another illustrates another exploded isometric view of the electronics enclosure system, in accordance with some embodiments of the present disclosure.

FIG. 5 illustrates an exploded isometric view of the electronics enclosure system 414. As illustrated, first shell 416 and a second shell 418 form enclosure 412. First shell 416 and second shell 418 may attach to each other by any suitable means. For example, the first shell 416 and the second shell 418 may be attached via at least one fastener 718 (e.g., screws, bolts, etc.) extending through the second shell 418 and threading into the first shell 416 and/or second shell 418. However, the at least fastener 718 may comprise any suitable device, material, etc. for attaching the first shell 416 to the second shell 418. Moreover, a mating seal 720 may be disposed between respective mating surfaces (e.g., a first mating surface 722 and a second mating surface 724) of the first shell 416 and the second shell 418. In the illustrated embodiment, the mating seal 720 comprises a gasket having a material suitable for downhole environments (e.g., high temperature, vibration, and shock). As such, the material for the mating seal 720 may be suitable for operating in temperatures between 200-500 degrees Fahrenheit. The material for the mating seal 720 may also be suitable for operating with downhole vibration having maximum amplitudes between 20-30 Gs RMS. Further, the material for the mating seal 720 may be suitable for operating with downhole shock having impulses between 250 Gs-2 ms to 1000 Gs-0.5 ms. In some embodiments, the mating seal 720 may comprise a sealant material such as a room-temperature-vulcanizing silicone (RTV) or other suitable materials.

Additionally, a thermally conductive elastomer 404 is disposed around the outer diameters of enclosure 412. As set forth above, the thermally conductive gel 426 may be applied to an exterior of the thermally conductive elastomer 404 before being installed in the pressure housing 406 (e.g., referring to FIG. 4). In the illustrated embodiment, the thermally conductive gel 426 is held in place by one or more seals 700 (e.g., a first seal 710 and a second seal 712). In some embodiments, the seals 700 may comprise O-rings. In the illustrated embodiment, the first seal 710 is disposed proximate a first end 714 of the enclosure 412 and the second seal 712 is disposed proximate the second end 716 of the enclosure 412. Further, the first seal 710 and the second seal 712 may be configured to retain the thermally conductive gel 426 in a space between the outer surface 420 of the enclosure 412 and the radially inner surface 424 of the pressure housing 406 (shown in FIG. 4). Retaining the thermally conductive gel 426 between the pressure housing 406 and the enclosure 412 may maintain a desired level of thermal conductivity between the pressure housing 406 and the enclosure 412. In some embodiments, a compensation system (e.g., a piston, a boot, etc.) may be configured to move based at least in part on a volume change of the thermally conductive gel 426 to reduce pressure on the one or more seals 700 and/or other components of the electronics enclosure system 414. The volume of the thermally conductive gel 426 may change in response to temperature and/or pressure in the downhole environment. Moreover, ground springs 702 may provide a positive ground path for one or more mating components.

Methods and systems described above are improvements over current technology. Improvements may comprise mounting circuit boards on individual shells with integrated end fittings, which may allow for each cover to attach to each other to form an enclosure. However, even though both individual shells are needed to form an enclosure, each shell with its corresponding circuit board may be a module that can be handled/stored by itself without the need to be attached to the other shell. This helps with modularity and assembly scheduling Additionally, there is no central chassis, which is a corner stone of current technology. For example, current technology mounts the boards on a central chassis and then attaches covers and end caps onto the chassis to form and enclosure. The system and methods described above eliminate fiberglass sleeves from the heat path and adds thermally conducive gel in its place to provide a more efficient thermal path. Further, some heat generating components are mounted directly to the shells to transfer heat directly to the enclosure, which may improve heat dissipation. Efficient heat dissipation path allows the use a variety of higher-powered electronic components which provides greater freedom in design of electoral circuits. Additionally, mounting techniques have two main components, a low number of parts helps with supply chain efficiencies, both with procurement and inventory. A low part count may also provide for simpler assembly processes. Modularity and reuse of the mechanical components reduces cost and turnaround time.

Statement 1. An electronics enclosure system may comprise a pressure housing comprising a thermally conductive material; a plurality of shells disposed within the pressure housing, wherein the plurality of shells are coupled together to form an enclosure, and wherein each shell of the plurality of shells comprises thermally conductive material; at least one circuit board secured to an inner surface of a respective shell of the plurality of shells; and a plurality of electronic components secured to the at least one circuit board, the plurality of shells, or some combination thereof.

Statement 2. The system of statement 1, wherein the plurality of shells comprises a first semi-cylindrical shell and a second semi-cylindrical shell coupled together to form a substantially cylindrical enclosure.

Statement 3. The system of statement 1 or statement 2, further comprising a thermally conductive elastomer positioned between an outer surface of the enclosure and an inner surface of the pressure housing.

Statement 4. The system of statement of any preceding statement, wherein the thermally conductive elastomer comprises a ridged shape that forms a plurality of cavities between the thermally conductive elastomer and the inner surface of the pressure housing.

Statement 5. The system of statement of any preceding statement, further comprising a thermally conductive gel disposed in the plurality of cavities between the thermally conductive elastomer and the pressure housing.

Statement 6. The system of statement of any preceding statement, wherein the thermally conductive elastomer comprises a silicone base material mixed with aluminum oxide, boron nitride, or some combination thereof.

Statement 7. The system of statement of any preceding statement, further comprising a mating seal, a first seal, and a second seal, wherein the mating seal is disposed between respective mating surfaces of a first shell and a second shell of the plurality of shells, and wherein the first seal and the second seal are configured to retain a thermally conductive gel in a space between an outer surface of the enclosure and an inner surface of the pressure housing, wherein the first seal is disposed proximate a first end of the enclosure, and wherein the second seal is disposed proximate a second end of the enclosure.

Statement 8. The system of statement of any preceding statement, wherein the at least one circuit board is rigidly secured to the inner surface of the respective shell of the plurality of shells via at least one board fastener.

Statement 9. The system of statement of any preceding statement, wherein at least one electronic component of the plurality of electronic components is rigidly secured directly to a respective shell of the plurality of shells via at least one component fastener.

Statement 10. The system of statement of any preceding statement, wherein the at least one electronic component comprises a magnetic component or a field-effect transistor (FET).

Statement 11. The system of statement of any preceding statement, wherein the pressure housing comprises a nickel chromium alloy.

Statement 12. The system of statement of any preceding statement, wherein each shell of the plurality of shells comprises an aluminum material.

Statement 13. The system of statement of any preceding statement, wherein the enclosure comprises a cylindrically shaped outer surface having an outer diameter smaller than an inner diameter of an inner surface of the pressure housing.

Statement 14. The system of statement of any preceding statement, wherein a thermally conductive elastomer is secured to an outer surface of the enclosure via an adhesive to rigidly connect the thermally conductive elastomer to the enclosure.

Statement 15. The system of statement of any preceding statement, wherein the circuit board comprises copper traces extending to an inner surface of the enclosure, wherein the copper traces are configured to conduct heat from the circuit board to the enclosure.

Statement 16. The system of statement of any preceding statement, further comprising at least one thermally conductive pad disposed between the plurality of electronic components and the enclosure, wherein the thermally conductive pad is configured to conduct heat from the plurality of electronic components to the enclosure.

Statement 17. An electronics enclosure system may comprise a pressure housing comprising a thermally conductive material, wherein the pressure housing comprises a hollow cylindrical shape; a first shell comprising a thermally conductive material; a second shell comprising a thermally conductive material, wherein the first shell and the second shell are coupled together to form an enclosure, and wherein the enclosure comprises a cylindrically shaped outer surface having an outer diameter smaller than an inner diameter of an inner surface of the pressure housing; a capacitor board secured to a first inner surface of the first shell; a power supply board secured to a second inner surface of the second shell; and a plurality of electronic components secured to the capacitor board, the power supply board, the first shell, and the second shell.

Statement 18. The system of statement 17, wherein the plurality of electronic components comprises at least one FET directly secured to the first shell and/or the second shell.

Statement 19. The system of statement 17 or statement 18, further comprising a thermally conductive elastomer secured to the cylindrically shaped outer surface of the enclosure and the inner surface of the pressure housing.

Statement 20. An electronics enclosure system may comprise a pressure housing comprising a thermally conductive material; a plurality of shells disposed within the pressure housing, wherein the plurality of shells are coupled together to form an enclosure, and wherein each shell of the plurality of shells comprises thermally conductive material; a thermally conductive elastomer secured to an outer surface of the enclosure and an inner surface of the pressure housing; a thermally conductive gel disposed between the elastomer and the pressure housing; at least one circuit board secured to an inner surface of a respective shell of the plurality of shells; at plurality of electronic components secured to the at least one circuit board, the plurality of shells, or some combination thereof; and at least one thermally conductive pad disposed between the plurality of electronic component and the enclosure, wherein the thermally conductive pad is configured to conduct heat from the plurality of electronic components to the enclosure.

The preceding description provides various examples of the systems and methods of use disclosed herein which may contain different method steps and alternative combinations of components. It should be understood that, although individual examples may be discussed herein, the present disclosure covers all combinations of the disclosed examples, including, without limitation, the different component combinations, method step combinations, and properties of the system. It should be understood that the compositions and methods are described in terms of "comprising," "containing," or "including" various components or steps, the compositions and methods can also "consist essentially of" or "consist of" the various components and steps. Moreover, the indefinite articles "a" or "an," as used in the claims, are defined herein to mean one or more than one of the element that it introduces.

For the sake of brevity, only certain ranges are explicitly disclosed herein. However, ranges from any lower limit may be combined with any upper limit to recite a range not explicitly recited, as well as, ranges from any lower limit may be combined with any other lower limit to recite a range not explicitly recited, in the same way, ranges from any upper limit may be combined with any other upper limit to recite a range not explicitly recited. Additionally, whenever a numerical range with a lower limit and an upper limit is disclosed, any number and any included range falling within the range are specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values even if not explicitly recited. Thus, every point or individual value may serve as its own lower or upper limit combined with any other point or individual value or any other lower or upper limit, to recite a range not explicitly recited.

Therefore, the present examples are well adapted to attain the ends and advantages mentioned as well as those that are inherent therein. The particular examples disclosed above are illustrative only and may be modified and practiced in different but equivalent manners apparent to those skilled in the art having the benefit of the teachings herein. Although individual examples are discussed, the disclosure covers all combinations of all of the examples. Furthermore, no limitations are intended to the details of construction or design herein shown, other than as described in the claims below. Also, the terms in the claims have their plain, ordinary meaning unless otherwise explicitly and clearly defined by the patentee. It is therefore evident that the particular illustrative examples disclosed above may be altered or modified and all such variations are considered within the scope and spirit of those examples. If there is any conflict in the usages of a word or term in this specification and one or more patent(s) or other documents that may be incorporated herein by reference, the definitions that are consistent with this specification should be adopted.

What is claimed is:

1. An electronics enclosure system, comprising:
a pressure housing comprising a thermally conductive material;
a plurality of shells disposed within the pressure housing, wherein the plurality of shells are coupled together to form an enclosure, and wherein each shell of the plurality of shells comprises a respective thermally conductive material;
at least one circuit board secured to an inner surface of a respective shell of the plurality of shells;
a plurality of electronic components secured to the at least one circuit board, the plurality of shells, or some combination thereof;
a mating seal disposed between respective mating surfaces of a first shell and a second shell of the plurality of shells;
a first seal disposed proximate a first end of the enclosure; and
a second seal disposed proximate a second end of the enclosure, wherein the first seal and the second seal are configured to retain a thermally conductive gel in a space between an outer surface of the enclosure and an inner surface of the pressure housing.

2. The system of claim 1, wherein the plurality of shells comprises a first semi-cylindrical shell and a second semi-cylindrical shell coupled together to form a substantially cylindrical enclosure.

3. The system of claim 1, further comprising a thermally conductive elastomer positioned between the outer surface of the enclosure and the inner surface of the pressure housing.

4. The system of claim 3, wherein the thermally conductive elastomer comprises a ridged shape that forms a plurality of cavities between the thermally conductive elastomer and the inner surface of the pressure housing.

5. The system of claim 4, further comprising the thermally conductive gel disposed in the plurality of cavities between the thermally conductive elastomer and the pressure housing.

6. The system of claim 3, wherein the thermally conductive elastomer comprises a silicone base material mixed with aluminum oxide, boron nitride, or some combination thereof.

7. The system of claim 1, wherein the at least one circuit board is rigidly secured to the inner surface of the respective shell of the plurality of shells via at least one board fastener.

8. The system of claim 1, wherein at least one electronic component of the plurality of electronic components is rigidly secured directly to the respective shell of the plurality of shells via at least one component fastener.

9. The system of claim 8, wherein the at least one electronic component comprises a magnetic component or a field-effect transistor (FET).

10. The system of claim 1, wherein the pressure housing comprises a nickel chromium alloy.

11. The system of claim 1, wherein each shell of the plurality of shells comprises an aluminum material.

12. The system of claim 1, wherein the enclosure comprises a cylindrically shaped outer surface having an outer diameter smaller than an inner diameter of the inner surface of the pressure housing.

13. The system of claim 1, wherein a thermally conductive elastomer is secured to the outer surface of the enclosure via an adhesive to rigidly connect the thermally conductive elastomer to the enclosure.

14. The system of claim 1, wherein the at least one circuit board comprises copper traces extending to an inner surface of the enclosure, wherein the copper traces are configured to conduct heat from the at least one circuit board to the enclosure.

15. The system of claim 1, further comprising at least one thermally conductive pad disposed between the plurality of electronic components and the enclosure, wherein the at least one thermally conductive pad is configured to conduct heat from the plurality of electronic components to the enclosure.

16. An electronics enclosure system, comprising:
a pressure housing comprising a thermally conductive material, wherein the pressure housing comprises a hollow cylindrical shape;
a first shell comprising a respective thermally conductive material;
a second shell comprising a second respective thermally conductive material, wherein the first shell and the second shell are coupled together to form an enclosure, and wherein the enclosure comprises a cylindrically shaped outer surface having an outer diameter smaller than an inner diameter of an inner surface of the pressure housing;
a capacitor board secured to a first inner surface of the first shell;
a power supply board secured to a second inner surface of the second shell;
a plurality of electronic components secured to the capacitor board, the power supply board, the first shell, and the second shell;
a mating seal disposed between respective mating surfaces of the first shell and the second shell of the plurality of shells;
a first seal disposed proximate a first end of the enclosure; and
a second seal disposed proximate a second end of the enclosure, wherein the first seal and the second seal are configured to retain a thermally conductive gel in a space between the cylindrically shaped outer surface of the enclosure and the inner surface of the pressure housing.

17. The system of claim 16, wherein the plurality of electronic components comprises at least one FET directly secured to the first shell and/or the second shell.

18. The system of claim 16, further comprising a thermally conductive elastomer secured to the cylindrically shaped outer surface of the enclosure and the inner surface of the pressure housing.

19. An electronics enclosure system, comprising:
a pressure housing comprising a thermally conductive material;
a plurality of shells disposed within the pressure housing, wherein the plurality of shells are coupled together to form an enclosure, and wherein each shell of the plurality of shells comprises a respective thermally conductive material;
a thermally conductive elastomer secured to an outer surface of the enclosure and an inner surface of the pressure housing;
a thermally conductive gel disposed between the thermally conductive elastomer and the pressure housing;
at least one circuit board secured to an inner surface of a respective shell of the plurality of shells;
a plurality of electronic components secured to the at least one circuit board, the plurality of shells, or some combination thereof;

at least one thermally conductive pad disposed between the plurality of electronic components and the enclosure, wherein the at least one thermally conductive pad is configured to conduct heat from the plurality of electronic components to the enclosure;
a mating seal disposed between respective mating surfaces of a first shell and a second shell of the plurality of shells;
a first seal disposed proximate a first end of the enclosure; and
a second seal disposed proximate a second end of the enclosure, wherein the first seal and the second seal are configured to retain the thermally conductive gel in a space between the thermally conductive elastomer and the inner surface of the pressure housing.

* * * * *